United States Patent [19]

McDavid

[11] Patent Number: 4,641,417
[45] Date of Patent: Feb. 10, 1987

[54] PROCESS FOR MAKING MOLYBDENUM GATE AND TITANIUM SILICIDE CONTACTED MOS TRANSISTORS IN VLSI SEMICONDUCTOR DEVICES

[75] Inventor: James M. McDavid, Dallas, Tex.

[73] Assignee: Texas Instruments Incorporated, Dallas, Tex.

[21] Appl. No.: 771,873

[22] Filed: Sep. 3, 1985

Related U.S. Application Data

[62] Division of Ser. No. 624,075, Jun. 25, 1984.

[51] Int. Cl.[4] .......................................... H01L 21/441
[52] U.S. Cl. ...................................... 29/571; 29/578; 29/591; 156/656
[58] Field of Search .......................... 29/571, 578, 591; 156/656

[56] References Cited

U.S. PATENT DOCUMENTS

| | | | |
|---|---|---|---|
| 3,632,433 | 1/1972 | Tokuyama et al. | 29/576 X |
| 4,027,321 | 5/1977 | Collins et al. | 357/54 X |
| 4,080,719 | 3/1978 | Wilting | 29/571 |
| 4,276,688 | 7/1981 | Hsu | 29/571 |
| 4,343,082 | 8/1982 | Lepselter et al. | 29/571 X |
| 4,425,700 | 1/1984 | Sasaki et al. | 29/571 |
| 4,471,524 | 9/1984 | Kinsbron et al. | 29/571 |
| 4,485,550 | 12/1984 | Koeneke et al. | 29/571 |
| 4,505,027 | 3/1985 | Schwabe et al. | 29/578 X |
| 4,521,952 | 6/1985 | Riseman | 29/578 X |
| 4,575,920 | 3/1986 | Tsunashima | 29/571 |

Primary Examiner—George T. Ozaki
Attorney, Agent, or Firm—N. Rhys Merrett; Richard L. Donalds; Richard A. Bachand

[57] ABSTRACT

Molybdenum-gate transistors with self-aligned, silicided source/drain regions are made by a process that avoids unwanted etching of the molybdenum of the gate when the unreacted metal used for siliciding is removed. The molybdenum gate is protected by encapsulating with a cap oxide and sidewall oxide; this encapsulation is applied in a manner to seal the interfaces between the two oxides. The oxides may be dual layer—first plasma deposited then phosphorus doped CVD oxide. A dilute sulphuric acid etch may be used to remove unreacted titanium employed for the siliciding.

14 Claims, 5 Drawing Figures

PROCESS FOR MAKING MOLYBDENUM GATE AND TITANIUM SILICIDE CONTACTED MOS TRANSISTORS IN VLSI SEMICONDUCTOR DEVICES

This is a division of application Ser. No. 624,075, filed June 25, 1984.

BACKGROUND OF THE INVENTION

This invention relates to semiconductor devices, and more particularly to manufacture of MOS VLSI transistors.

Molybdenum gate MOS access transistors and molybdenum word lines are employed in high density DRAM arrays, such as the 1-Megabit devices, due to the lower resistance of molybdenum compared to polysilicon. Likewise, it is advantageous to silicide or clad the surface of the source/drain (moat) regions for these access transistors to lower the series resistance of the such regions. However, problems have occurred in attempts to execute both metal-gate and direct-react clad-moat processes on the same devices due to the fact that the chemicals used to strip the unreacted metal in a clad-moat process can attack the metal gate material through defects in the metal-gate encapsulation layers. Theoretically, this problem could be solved by the use of an unreacted titanium-metal stripping-acid which does not attack molybdenum metal. Examples would be dilute hydrochloric acid or dilute sulfuric acid. In practice, it has been found that a selective acid technique based on consideration of the gate and cladding materials does not work for the following reasons: the metal deposited for moat cladding reacts to form a silicide over exposed silicon regions but does not remain to be a pure metal over the oxide regions as desired, due to reaction of the titanium with the siliciding-furnace gases and with the plasma-oxide encapsulation. Dilute hydrochloric acid is not effective in removing the furnace-processed titanium. Dilute sulfuric acid removes the furnace-processed titanium-metal but stops on a conducting interface layer formed at the plasma oxide encapsulation interface.

It is the principal object of this invention to provide an improved method of making VLSI MOS devices, particularly metal-gate clad-moat devices. Another object is to provide a method of etching un-reacted refractory metal from a surface of a silicon slice without undesired etching of encapsulated refractory metal gates.

SUMMARY OF THE INVENTION

In accordance with one embodiment of the invention, the essential point is that by using a two layer glass encapsulation (or equivalently a doped glass with a continuously varied doping concentration) consisting of undoped glass on the bottom layer and phosphorous-doped glass on the upper layer, it becomes possible to remove the furnace-processed titanium with dilute sulfuric acid alone. The formation of the conducting interface layer (which is not removed by sulfuric acid as discussed above) does not occur when the additional layer of phosphorus-doped glass (phosphosilicate glass) is deposited and densified. This dual layer feature is in contrast to the previously used process flow in which only an undoped plasma-oxide layer was used both in the cap oxide and in the sidewall oxide layers. In a process not using a cap oxide, such as a self-aligned silicide process, the technique of the invention would serve to eliminate the gate-to-drain shorts (due to the conducting interface layer) which commonly occur.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
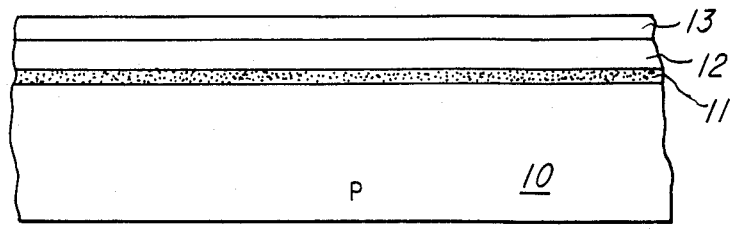
FIGS. 1-5 are elevation views, in section, greatly enlarged, of a vary small part of a semiconductor slice, at various stages in a manufacturing process according to the invention.
Figure 2:
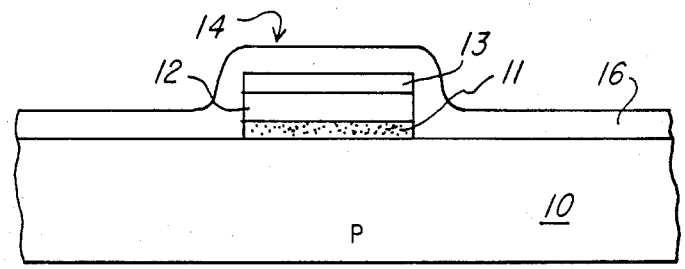
Figure 3:
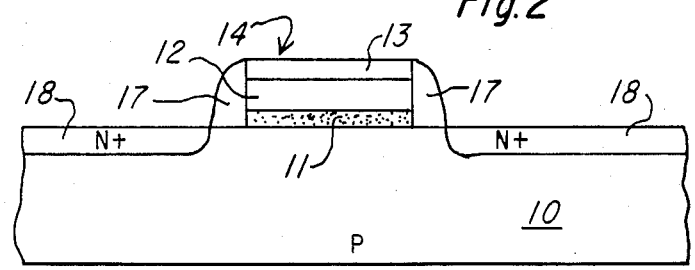
Figure 4:
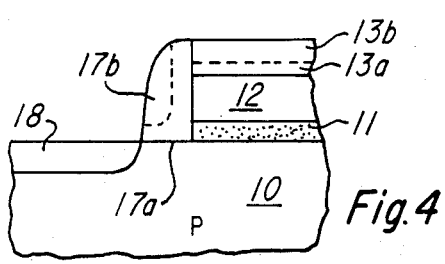

Referring to FIGS. 1-5, a method of making a molybdenum-gate transistor with silicided source/drain regions will be described. As seen in FIG. 1, a silicon substrate 10 is coated with a thin thermal oxide 11 which will function as the gate oxide. This oxide 11 may be, for example, 200 to 300 Å thick. A layer 12 of molybdenum is applied over the gate oxide 11, with a thickness of perhaps 2500 Å. The molybdenum is covered with a cap oxide layer 13 by deposition of silicon oxide. Next, as seen in FIG. 2, the gate is defined by photolithographic patterning in the usual manner, to leave a transistor gate 14 having a size of perhaps 1.5 or 2 microns, more or less. The face is coated with another silicon oxide coating 16, and this coating is subjected to an anisotropic etch, such as RIE etch, to leave only the sidewall oxide 17 as seen in FIG. 3.

An N+ implant, using arsenic as a dopant, is performed at this point to create the source/drain regions 18, as seen in FIG. 3. These regions 18 are also referred to as moat regions, and are to be subsequently silicided or clad, as will be described. First, some measure must be taken to protect the molybdenum 12 from reacting with the etchant to be subsequently used.

According to the invention, one method of protecting the molybdenum is to add a steam densification step at this point in the process for purpose of more perfectly joining the separately-deposited cap oxide 13 and sidewall plasma oxide 17. This seals the junctions 19. The steam densification may be done at, for example, 900° C. in steam for nine minutes.

According to another embodiment, a higher quality oxide is provided by replacing one or both of the plasma deposited cap-oxide 13 or sidewall-oxide 17 by a layer structure consisting of a very thin but continuous plasma oxide layer (which allows introduction of the previously bare molybdenum into a furnace), and a thicker layer of high-temperature, low-pressure chemical vapor deposited oxide. The structure would then appear as in FIG. 4, which is like FIG. 3 but enlarged; here the layers 12 and 17 appear as dual layers 13a and 13b, and 17a and 17b.

The two-layered version just described could also be accomplished by phosphorus doped, atmospheric-pressure, chemical-vapor-deposited oxide 13 and 17 (instead of plasma deposited oxide). This CVD oxide, also referred to as phosphosilicate glass or PSG, would be deposited using a multiple-pass deposition apparatus, but using a single pass rather than the usual multiple passes employed for thick MLO or multilevel oxide. This apparatus offers the advantage of greater control, compared to that available from single-layer thick MLO apparatus used for this single layers. The target would be a PSG layer 13b or 17b of 2000 or 1500 Å thickness, over a plasma deposited oxide layer 13a or 17a of 1000 Å or 500 Å, respectively. This gives a total of 3000 Å for the sidewall oxide 17. The cap oxide 13 is about 2000 Å for the two layers.

The use of PSG glass for the second layer offers the advantages of (1) less stress and tendency to crack, and (2) ability to assist in the gettering of sodium or other mobile ions which may be associated with the metal gate processing.

Figure 5:
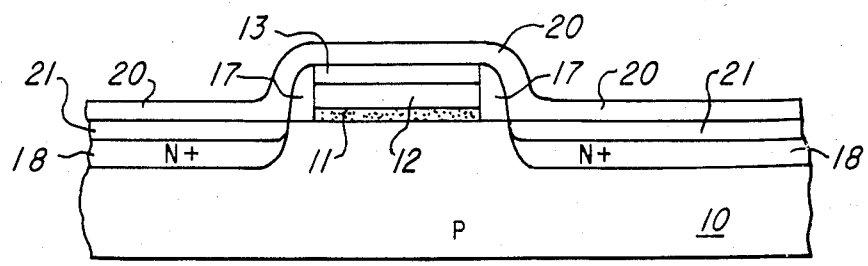

The processing is continued by depositing a thin coating 20 of titanium as seen in FIG. 5, and subjecting the slice to heat in a furnace to react the titanium with silicon to create titanium silicide 21 on the surface of the moat areas. The titanium 20 remaining on top of the gate 15 is removed using dilute sulphuric acid alone.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a transistor device, comprising the steps of:
    forming a gate electrode on a face of a silicon body, with an oxide coating on the top of said gate electrode,
    forming oxide coatings on the sidewalls of said gate electrode by depositing oxide and anisotropically etching,
    wherein said oxide coatings on the top and sidewalls of the gate electrode are created by separate depositions but are sealed together to be impervious at the interfaces between the oxide coatings,
    applying a layer of metal over said face and reacting said metal with the silicon of the face in areas not covered by the gate electrode and sidewall oxide,
    and thereafter removing unreacted metal from said face by etching without disturbing the gate electrode.

2. A method according to claim 1 wherein said gate electrode is a refractory metal and said layer of metal is different refractory metal.

3. A method according to claim 1 wherein each of said oxide coatings include a first plasma-deposited coating and a second phosphorus-doped CVD oxide coating.

4. A method according to claim 1 wherein said layer of metal is titanium.

5. A method according to claim 4 wherein said step of etching uses dilute sulphuric acid.

6. A method according to claim 1 wherein said gate electrode is molybdenum, said layer of metal is titanium, and said step of etching uses sulphuric acid.

7. A method according to claim 6 wherein said oxide coatings are two-layered with a plasma-deposited layer and a phosphosilicate glass layer.

8. A method of making a semiconductor device, comprising the steps of:
    forming an electrode on a face of a silicon body, with an oxide coating on the top of said electrode,
    forming oxide coatings on the sidewalls of said electrode by depositing oxide and anisotropically etching,
    wherein said oxide coatings on the top and sidewalls of the electrode are created by separate depositions but are sealed together to be impervious at the interfaces between the oxide coatings,
    applying a layer of a conductive material over said face and reacting said material with the silicon of the face in areas not covered by the electrode and sidewall oxide,
    and thereafter removing unreacted conductive material from said face by selectively etching the conductive material without etching the electrode.

9. A method according to claim 8 wherein said electrode is a refractory metal and said layer of conductive material is different refractory metal.

10. A method according to claim 8 wherein each of said oxide coatings includes a first plasma-deposited coating and a second phosphorus-doped CVD oxide coating.

11. A method according to claim 8 wherein said layer of conductive material is titanium.

12. A method according to claim 11 wherein said step of etching uses dilute sulphuric acid.

13. A method according to claim 8 wherein said electrode is molybdenum, said layer of conductive material is titanium, and said step of etching uses sulphuric acid.

14. A method according to claim 13 wherein said oxide coatings are two-layered with a plasma-deposited layer and a phosphosilicate glass layer.

* * * * *